United States Patent [19]

Ohshita

[11] 4,390,834
[45] Jun. 28, 1983

[54] DIGITAL VOLUME CONTROL

[75] Inventor: Akihiro Ohshita, Higashihiroshima, Japan

[73] Assignee: Sharp Kabushiki Kaisha, Osaka, Japan

[21] Appl. No.: 360,049

[22] Filed: Mar. 19, 1982

Related U.S. Application Data

[63] Continuation of Ser. No. 188,566, Sep. 18, 1980.

[30] Foreign Application Priority Data

Feb. 25, 1980 [JP] Japan ................................ 55/23283

[51] Int. Cl.³ ............................................. H02J 3/12
[52] U.S. Cl. ................................ 179/1 VL; 323/354; 377/45
[58] Field of Search ............... 179/1 VL; 307/222 R; 328/44; 323/350, 354; 330/129, 144, 284

[56] References Cited

U.S. PATENT DOCUMENTS 3,177,350 4/1965 Abbott et al. ................... 330/144 X
3,961,281 6/1976 Woolling et al. ................. 330/129
4,238,724 12/1980 Klaus et al. ....................... 323/354

Primary Examiner—William M. Shoop
Attorney, Agent, or Firm—Birch, Stewart, Kolasch and Birch

[57] ABSTRACT

A digital control type volume control circuit is disclosed herein which includes a multivibrator, an UP key, a DOWN key, a pair of binary UP/DOWN counters, a 4-to-16 line decoder, an encoder and an attenuator. The multivibrator is connected to the UP and DOWN keys to furnish pulses to the counter via an actuated one of the UP and DOWN keys. The counter counts the number of the pulses via the UP and DOWN key, with the counter being indicative of the length of actuation of the UP or DOWN key. The encoder responsive to the count of the counter output count provides an output for the attenuator having a plurality of resistors of different resistances for determination as to the amount of attenuation.

9 Claims, 6 Drawing Figures

DIGITAL VOLUME CONTROL

This application is a continuation of copending application Ser. No. 188,566, filed on Sept. 18, 1980.

BACKGROUND OF THE INVENTION

This invention relates to a digital type volume control circuit arrangement for use in a variety of audio equipments which regulates the intensity of a reproduced sound by virtue of electronics.

A potentiometer is a well-known electro-mechanical component which is used to vary the loudness of a reproduced sound by varying the audiofrequency signal voltage, but lacks accuracy of volume regulation. In recent years, an electronic volume control has been developed as a substitute for the mechanical potentiometer and adapted for use in remote controls for television receivers. This sort of control uses an analog attenuator which can attenuate the magnitude of a sound in a continuous fashion by varying the collector currents of transistors therein and thus the internal resistance of the attenuator. With this arrangement, the controlling factor is therefore DC voltage or current of an analog amplitude, thus resulting in disadvantages: increased distortion, poor S/N property, small allowable input, temperature dependence of attenuation, decreased maximum attenuation, etc. Accordingly, such an electronic volume control is not suited for audio amplifiers which demand high power and low distortion factor. Potential elements for use in volume controls of audio amplifiers are lamps which cause variations in internal resistance with varying current, thermistors which cause variations in internal resistance with varying temperature and CdS elements which cause variations in internal resistance with varying intensity of light. However, the lamps have the disadvantages of a limited range of resistance, great fluctuations between channels when used in multichannel audio amplifiers and inferior performance. The thermistors suffer from the influence of variations in ambient temperature as well as exhibiting dull response and channel-to-channel fluctuations. The photosensitive elements disadvantageously suffer increased distortion, inferior S/N properties and channel-to-channel fluctuations.

OBJECTS OF THE INVENTION

Accordingly, it is an object of the present invention to provide an improvement in a volume control device which is more reliable and accurate than the prior art devices by using advanced electronics.

Another object of the present invention is to provide an improved volume control device which suffers none of the disadvantages of the prior art devices, for example, mechanical noise, lack of reliability, complexity of construction, increased cost, etc.

BRIEF DESCRIPTION OF THE DRAWINGS

For a more complete understanding of the present invention and for further objects and advantages thereof, reference is now made to the following description take in conjunction with the accompanying drawings, in which.

DETAILED DESCRIPTION OF THE EMBODIMENT

Figure 1:
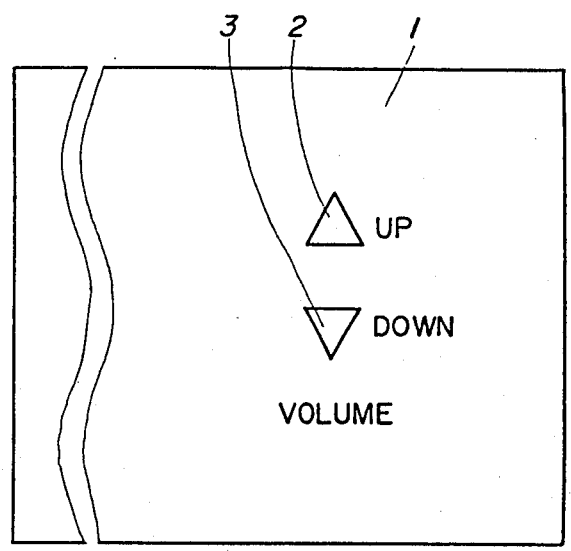
FIG. 1 is a schematic plan view of an operational panel having volume control keys according to the present invention.

Attention is first invited to FIG. 1, a schematic plan view of an operational panel of an audio amplifier, which panel carries an UP key 2 and a DOWN key 3 operatively associated with a volume control scheme constructed in accordance with the present invention. With the operation of the present volume control scheme, the loudness of a sound reproduced by the audio amplifier constantly increases or decreases gradually while the UP or DOWN key is being depressed, respectively. Both switches are of a push switch type wherein its contacts are closed only when depressed. The previous loudness of the sound is kept unless either of the keys is further actuated.

Figure 3:
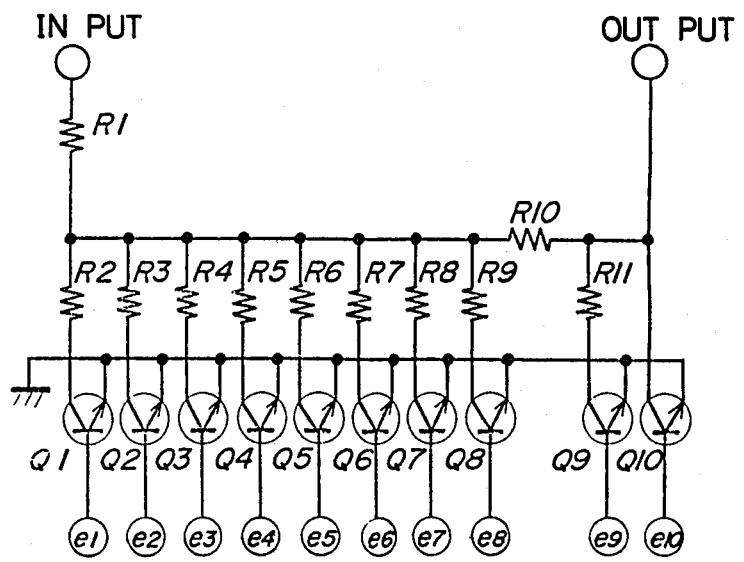
FIG. 3 is a circuit diagram of an attenuator responsive to the outputs of an encoder contained in the device of FIG. 2.
Figure 2:
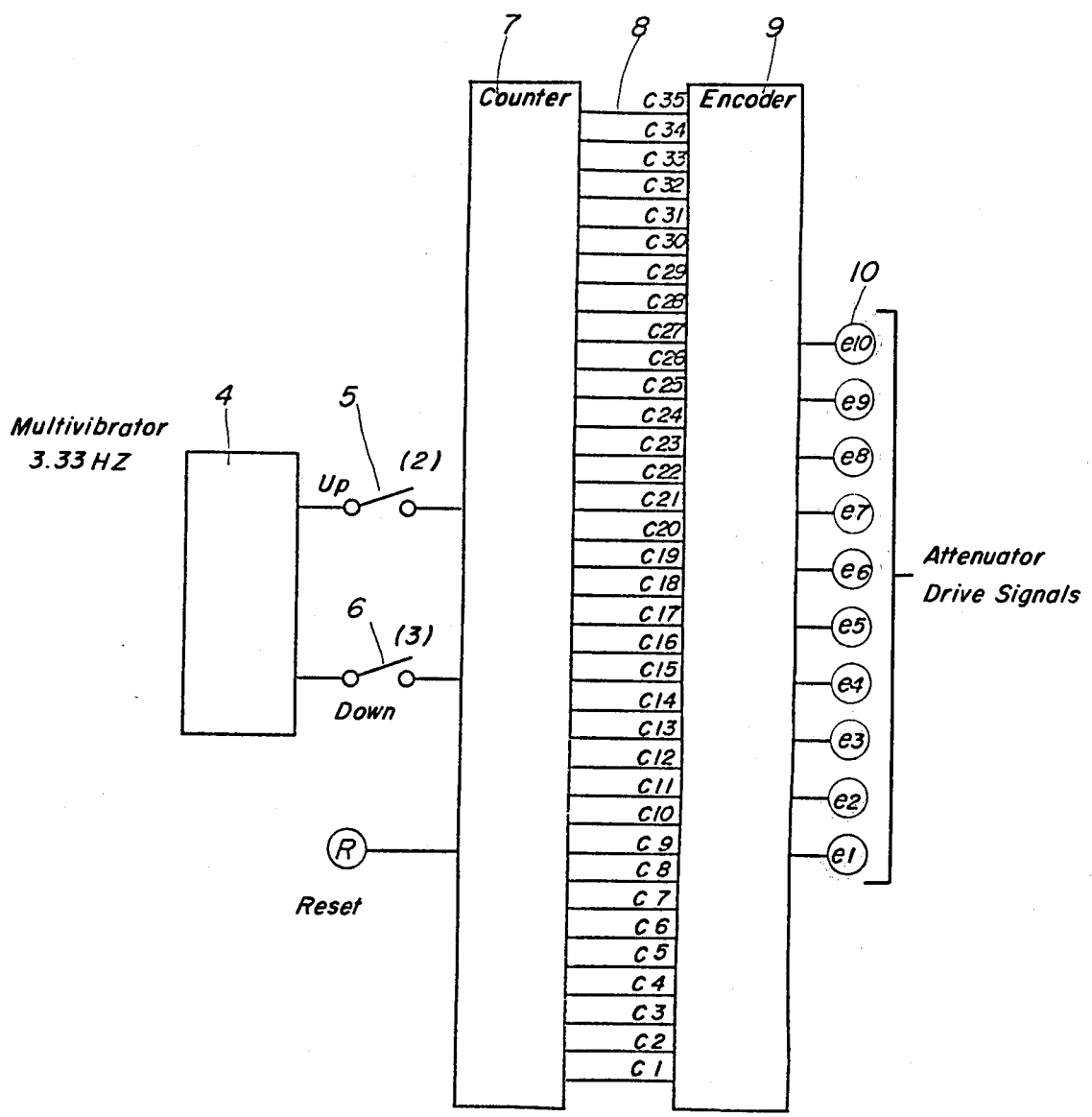
FIG. 2 is a block diagram of a volume control circuit arrangement according to the present invention.

FIG. 2 illustrates a schematic block diagram of electronics of the volume control scheme. An unstable multivibrator 4 is adapted to oscillate at a specific frequency (say, 3.33 Hz). Respective inputs of a counter 7 receive the output pulses of the multivibrator 4 as selected by the UP switch 5 or the DOWN switch 6. An output signal having a high level (H) developed at one of output terminals $C_1$–$C_{35}$, with all of the remaining terminals deriving an output signal of a low level (L). Assume now that the first output signal with the high level exists at the terminal $C_1$ upon an actution of the UP or DOWN switch. Whenever a pulse is applied thereto, the high level output goes toward the next succeeding upper output terminal one by one. For example, when the pulse is applied ten times, the high level output signal stands at the output terminal $C_{11}$. The output terminal at which the H level signal is developed is generally designated $C_S$. Thus, that terminal is labeled $C_{(S+N)}$ after the pulse is applied N times. In the given example, only the terminals up to $C_{35}$ are shown. Similarly, the output terminal when the pulse is applied N times in response to actuations of the DOWN switch is labeled $C_{(C-N)}$. The encoder 9 accepts as its input the output of the counter 7 and delivers an encoded output at its output terminals 10 ($e_1$–$e_{10}$) according to the inputs from the respective output terminals $C_1$–$C_{35}$ as will be evident from the following table. As best shown in FIG. 3, an attenuator includes a set of resistors $R_1$–$R_{11}$ and a set of transistors $Q_1$–$Q_{10}$ each of the base current-controlled analog switch configuration. The resistance of each the resistors $R_1$–$R_{11}$ is determined by a required amount of attenuation. When an output signal having a high level (H) is developed at any of the output terminals of the encoder 9, base current flows in a corresponding one of the transistors $Q_1$–$Q_{10}$ to render that transistor conductive in its collector-to-emitter path. The output of the attenuator of FIG. 3 is connected to the audio amplifier for determining the gain of the amplifier. In the given example, the resistors $R_1$–$R_{11}$ are typically 10, 39, 15, 6.8, 3.3, 1.5, 0.68, 0.33, 0.15, 2.2 and 0.15 kilo-ohmns.

| ENCODER INPUT ("H" LEVEL) | ENCODER OUTPUT ("H" LEVEL) | | | | | ATTENUATE (dB) |
|---|---|---|---|---|---|---|
| $C_{35}$ | | | | | | 0 |
| $C_{34}$ | $e_1$ | | | | | 1.98 |
| $C_{33}$ | $e_2$ | | | | | 4.44 |
| $C_{32}$ | $e_1$ | $e_2$ | | | | 5.68 |
| $C_{31}$ | $e_3$ | | | | | 7.86 |
| $C_{30}$ | $e_2$ | $e_3$ | | | | 9.93 |
| $C_{29}$ | $e_4$ | | | | | 12.11 |
| $C_{28}$ | $e_1$ | $e_2$ | $e_4$ | | | 13.9 |
| $C_{27}$ | $e_1$ | $e_2$ | $e_3$ | $e_4$ | | 16.16 |
| $C_{26}$ | $e_5$ | | | | | 17.69 |
| $C_{25}$ | $e_1$ | $e_2$ | $e_3$ | $e_5$ | | 20.05 |
| $C_{24}$ | $e_1$ | $e_3$ | $e_4$ | $e_5$ | | 21.89 |
| $C_{23}$ | $e_6$ | | | | | 23.92 |
| $C_{22}$ | $e_3$ | $e_4$ | $e_6$ | | | 26.11 |
| $C_{21}$ | $e_4$ | $e_5$ | $e_6$ | | | 28.1 |
| $C_{20}$ | $e_7$ | | | | | 29.91 |
| $C_{19}$ | $e_3$ | $e_5$ | $e_7$ | | | 31.92 |
| $C_{18}$ | $e_2$ | $e_4$ | $e_6$ | $e_7$ | | 33.93 |
| $C_{17}$ | $e_8$ | | | | | 36.61 |
| $C_{16}$ | $e_6$ | $e_8$ | | | | 38.32 |
| $C_{15}$ | $e_3$ | $e_9$ | | | | 40.46 |
| $C_{14}$ | $e_4$ | $e_9$ | | | | 42.27 |
| $C_{13}$ | $e_1$ | $e_3$ | $e_4$ | $e_9$ | | 43.91 |
| $C_{12}$ | $e_2$ | $e_5$ | $e_9$ | | | 45.9 |
| $C_{11}$ | $e_3$ | $e_4$ | $e_5$ | $e_9$ | | 48.21 |
| $C_{10}$ | $e_6$ | $e_9$ | | | | 49.9 |
| $C_9$ | $e_3$ | $e_4$ | $e_6$ | $e_9$ | | 51.67 |
| $C_8$ | $e_3$ | $e_4$ | $e_5$ | $e_6$ | $e_9$ | 53.76 |
| $C_7$ | $e_3$ | $e_4$ | $e_7$ | $e_9$ | | 55.95 |
| $C_6$ | $e_6$ | $e_7$ | $e_9$ | | | 57.93 |
| $C_5$ | $e_3$ | $e_4$ | $e_5$ | $e_6$ | $e_7$ $e_9$ | 59.67 |
| $C_4$ | $e_5$ | $e_8$ | $e_9$ | | | 61.8 |
| $C_3$ | $e_3$ | $e_4$ | $e_5$ | $e_6$ | $e_8$ $e_9$ | 63.71 |
| $C_2$ | $e_4$ | $e_5$ | $e_6$ | $e_7$ | $e_8$ $e_9$ | 65.95 |
| $C_1$ | $e_7$ | $e_8$ | $e_{10}$ | | | ∞ |

Figure 4:
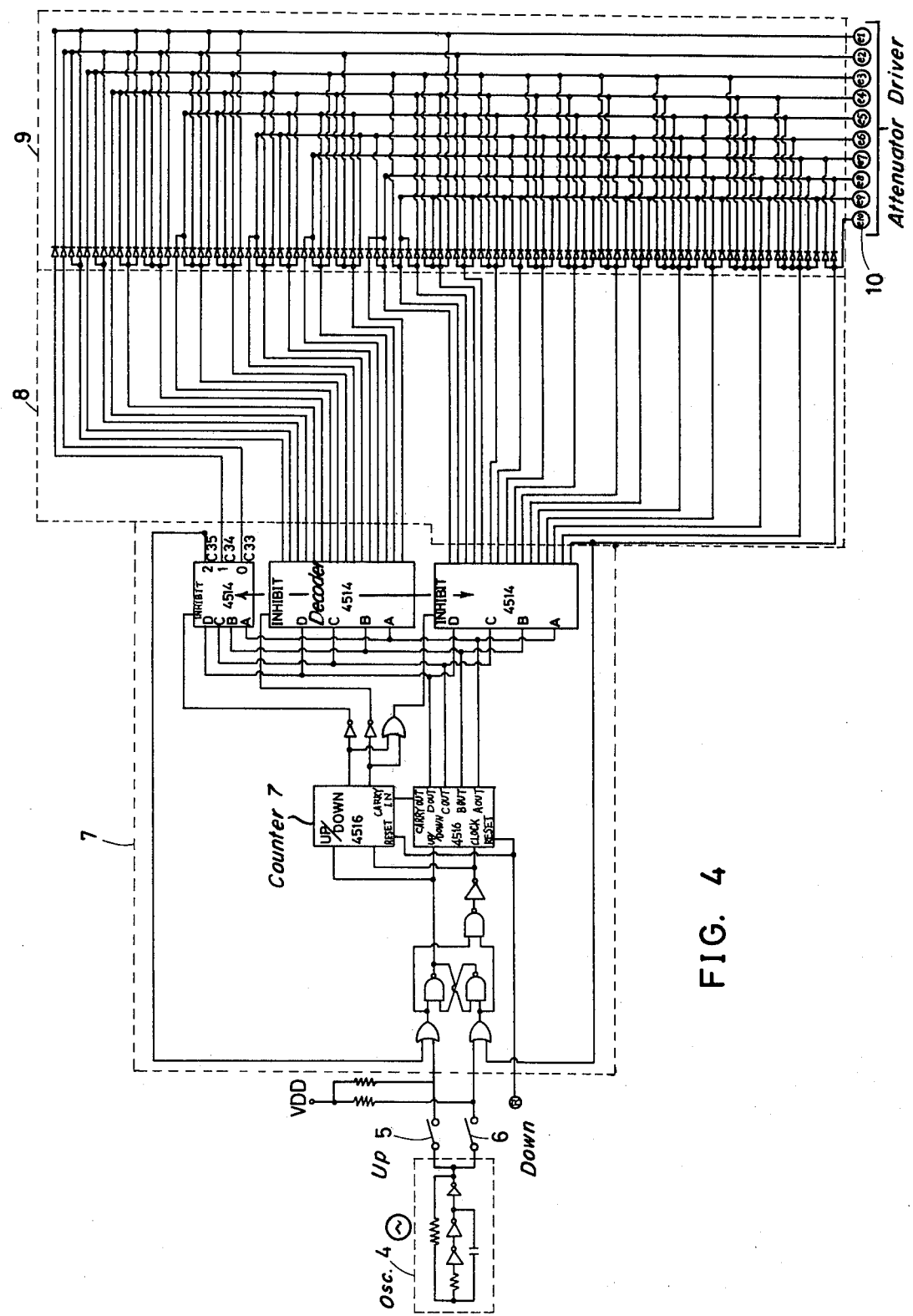
FIG. 4 is a detailed circuit diagram of the volume control device of FIG. 2.
Figure 5:
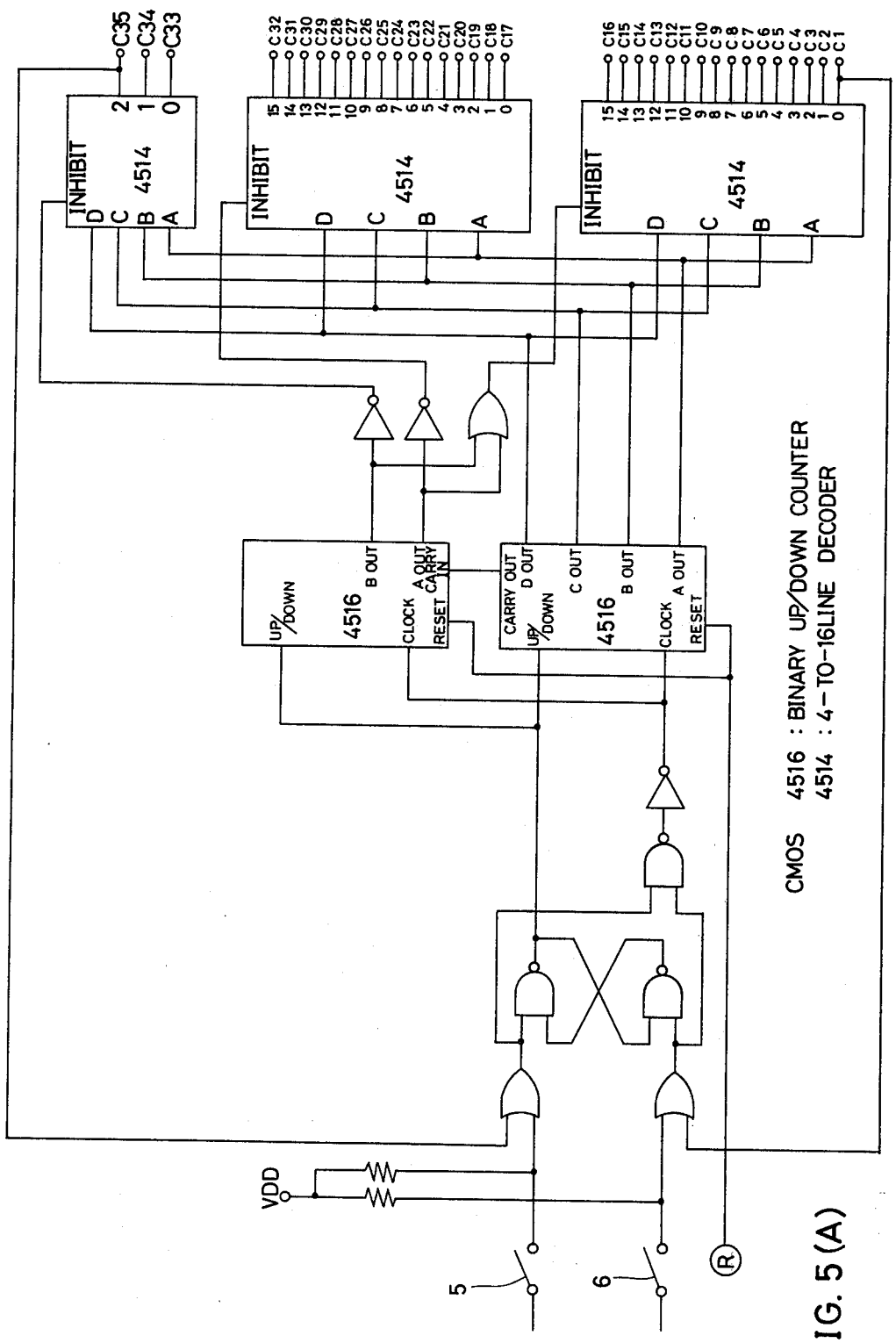
FIGS. 5(A) and 5(B) show details of a counter and the encoder shown in FIGS. 2 and 4.
Figure 5B:
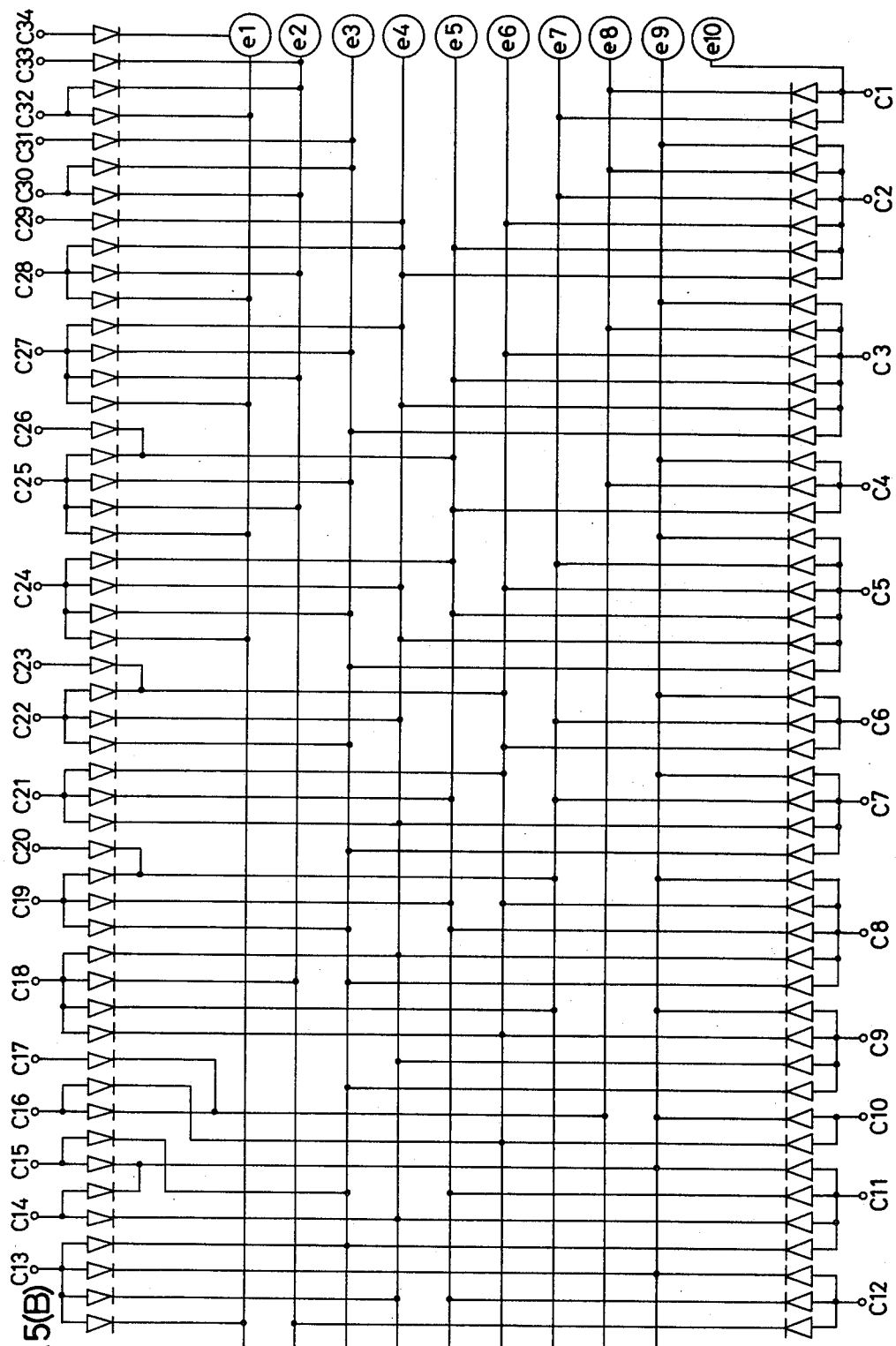

FIGS. 4, 5(A) and 5(B) show details of an exemplary implementation of the volume control scheme. Integrated circuit IC 4516 is an UP/DOWN counter which can count pulses of up to 4 bits. In the illustrated example, two IC 4516's (a total capacity: 8 bits with two bits redundant) are used to implement the above mentioned counter 7. IC 4514 is a decoder which converts 4 bit information into one of 16 individual signals. The input signal via the switch 5 or 6 is counted and converted into the corresponding 6 bit output through IC 4516, which output in turn appears at one of 35 output terminals of IC 4514. In the illustrated example, the counter is prohibited from counting down to less than $C_1$ or counting up to more than $C_{35}$. FIG. 5(B) depicts a typical example of the encoder 9 of a diode array which receives the output from any of $C_1$–$C_{35}$ and delivers the corresponding one of $e_1$–$e_{10}$ as enumerated in the above table.

The following sets forth how to operate the volume control scheme according to the present invention.

(1) RESETTING COUNTER

Application of a pulse to a reset terminal R of the counter of FIG. 2 places the counter into the reset state where the output of the counter 7 appears at the output terminal $C_1$. At this moment the amount of attenuation is infinite in dB as is clear from the above table.

(2) SETTING ABOUT 30 dB OF ATTENUATION UPON ACTUATION OF UP KEY

Upon depression of the UP switch 2 the contacts of the UP switch 5 are closed so that the pulse from the unstable multivibrator 4 is furnished to the UP input of the counter 7. In order to set about 30 dB of attenuation, it is necessary to shift the "H" level output from the output terminal $C_1$ to $C_{20}$. As indicated previously, this demands 19 pulses. It is understood that the multivibrator 4 oscillates at a frequency of about 3.33 Hz and thus an interval of about 0.3 second. In other words, the UP key 2 should be held depressed for 5.5 seconds to furnish the 19 pulses.

(3) SETTING ABOUT 40 dB OF ATTENUATION UPON ACTUATION OF DOWN KEY

When the DOWN key 3 is depressed, the associated DOWN switch 6 is closed to lead the pulse from the unstable multivibrator 4 to the DOWN input side of the counter 7. As stated in paragraph (2), it is necessary to vary the output level of the counter 7 from the output terminal $C_{20}$ to $C_{15}$ in order to modify the amount of attenuation from about 30 dB to about 40 dB, thus requiring five pulses. It is also obvious from the foregoing that the DOWN key 3 should be depressed for 1.3 –1.4 seconds in order to attain about 40 dB (40.46) of attenuation. It is obvious in the art that the encoder 9 may be implemented with a well known microprocessor.

As noted earlier, the volume control scheme of the present invention is of the digital type which is able to vary the amount of attenuation with a higher degree of accuracy and typically every 2 dB within the range covering from 0 dB to 66 dB in the above illustrated example. It is noted that, while the loudness of a reproduced sound varies in up to 34 steps, the number of the transistors for determination of the amount of attenuation is no more than 10. Appropriate combinations of the resistances of the resistors $R_1$–$R_{11}$ provide accuracy of determination as to attenuation. The present volume control scheme has significant advantages over the prior art: it is free from any influence of vibrations, becomes less fatigued by aging and suffers no space requirement with respect to a printed circuit board. It further offers minimum distortion, excellent S/N property, independency of varying ambient temperature, increased allowable input, an increase in the amount of attenuation, a minimum of operational failure, quick response and reduced channel-to-channel fluctuation through the utilization of the digital attenuator. The present volume control scheme is most desirable to use in remote controls of audio equipments because of the highly reliable electronic configuration. The major distinction between the prior art mechanical device and the present volume control scheme is that the former is more expensive and more complicated and less reliable.

Whereas the present invention has been described with respect to specific embodiments thereof, it will be understood that various changes and modifications will be suggested to one skilled in the art, and it is intended to encompass such changes and modifications as fall within the scope of the appended claims.

I claim:
1. A volume control circuit comprising:
  encoder means for generating attenuation constraining enabling signals for said semiconductor switch means;
  actuator means for initiating volume control operation by generating a number of pulses;
  counter means for counting the number of pulses supplied via said actuator means and providing an electrical representation of the number of said pulses to said encoder means to define a corresponding attenuation level and attenuator circuit means connected to said semiconductor switch means for providing the level of attenuation constrained by said encoder means.

2. Volume control circuit means comprising:
oscillator means for generating pulses;
encoder means responsive to the number of pulses generated for generating enabling signals representing volume attenuation levels corresponding said numbers of said pulses;
actuator means operatively connected to said oscillator means for initiating a volume control operation;
counter means for counting the number of said pulses supplied by said oscillator means and providing an electrical representation of the number of said pulses for said encoder means;
semiconductor switch means responsive to said enabling signals for selectively controlling the volume control attenuation level provided by said volume control circuit means; and
resistor circuit means connected to and responsive to said semiconductor switch means for providing said level of volume control attenuation.

3. Volume control circuit means according to claim 1 wherein each of said semiconductor switch means comprising a base current controlled transistor.

4. Volume control circuit means according to claim 1 wherein said attenuator circuit means comprises a plurality of resistors each having a different resistance.

5. Volume control circuit means according to claim 1 wherein said actuator means includes an UP key and a DOWN key and said counter means is an UP/DOWN counter.

6. Volume control circuit means according to claim 5 wherein said number of said pulses corresponds to the period of time for which said UP or DOWN key is being actuated.

7. Volume control circuit means according to claim 1 wherein said counter means comprises an integrated circuit and said encoder means comprises a diode array.

8. A volume control circuit according to claim 1 further comprising decoder means interposed between said counter means and said encoder means correlating the count of said counter means with said encoder means.

9. Volume control circuit means comprising:
volume controlling switch means;
encoder means for generating enabling signals for said switch means;
actuator means for initiating a volume control operation by supplying a plurality of pulses;
counter means for counting the number of pulses supplied via said actuator means and providing an electrical representation of the number of said pulses for said encoder means; and
resistor circuit means selectively connected to said switch means in response to said enabling signals for determining the amount of attenuation.

* * * * *

UNITED STATES PATENT AND TRADEMARK OFFICE
CERTIFICATE OF CORRECTION

PATENT NO. : 4,390,834

DATED : June 28, 1983

INVENTOR(S) : Akihiro Ohshita
Higashihiroshima, Japan

It is certified that error appears in the above-identified patent and that said Letters Patent is hereby corrected as shown below:

In column 4, claim 1, after line 58, the following is inserted:

--volume controlling semi-conductor switch means--

Signed and Sealed this

Fifth Day of March 1985

[SEAL]

Attest:

DONALD J. QUIGG

Attesting Officer  Acting Commissioner of Patents and Trademarks